(12) United States Patent
Wei et al.

(10) Patent No.: US 11,652,456 B2
(45) Date of Patent: *May 16, 2023

(54) TRANS-IMPEDANCE AMPLIFIER, CHIP, AND COMMUNICATIONS DEVICE

(71) Applicant: HUAWEI TECHNOLOGIES CO., LTD., Guangdong (CN)

(72) Inventors: Baoyue Wei, Shenzhen (CN); Yuemiao Di, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/443,717

(22) Filed: Jul. 27, 2021

(65) Prior Publication Data

US 2022/0021360 A1    Jan. 20, 2022

Related U.S. Application Data

(63) Continuation of application No. 16/825,708, filed on Mar. 20, 2020, now Pat. No. 11,095,259, which is a
(Continued)

(30) Foreign Application Priority Data

Feb. 23, 2017    (CN) .......................... 201710099963.5

(51) Int. Cl.
*H03F 3/45*       (2006.01)
*H03F 3/195*     (2006.01)
(Continued)

(52) U.S. Cl.
CPC ......... *H03F 3/45071* (2013.01); *H03F 1/083* (2013.01); *H03F 3/195* (2013.01);
(Continued)

(58) Field of Classification Search
CPC ...... H03F 3/45071; H03F 1/083; H03F 3/195; H03F 3/245; H03F 3/45475;
(Continued)

(56) References Cited

U.S. PATENT DOCUMENTS 6,583,662 B1    6/2003   Lim
6,816,004 B2 *  11/2004  Easwaran ............. H04L 5/1461
                                                     327/552
(Continued)

FOREIGN PATENT DOCUMENTS

CN    101807885 A    8/2010
CN    101873128 A    10/2010
(Continued)

*Primary Examiner* — Hieu P Nguyen
(74) *Attorney, Agent, or Firm* — James Anderson Harrison

(57) ABSTRACT

A trans-impedance amplifier (TIA) includes a first circuit, a second circuit, and a third circuit. Both the first circuit and the second circuit are coupled to a current source, an operational amplifier, and the third circuit. The first circuit is configured to receive a first current, provide a third voltage to the third circuit, perform shape filtering on the first current, and convert the shape filtered first current to a first voltage for output. The second circuit is configured to receive a second current, provide a fourth voltage to the third circuit, perform shape filtering on the second current, and convert the shape filtered second current to a second voltage for output. The third circuit is configured to cooperate with the first circuit and the second circuit in performing shape filtering. The operational amplifier is configured to provide a small-signal virtual ground point to the first circuit.

12 Claims, 6 Drawing Sheets

Related U.S. Application Data continuation of application No. 15/894,467, filed on Feb. 12, 2018, now Pat. No. 10,637,416.

(51) Int. Cl.
*H03F 3/24* (2006.01)
*H03F 1/08* (2006.01)

(52) U.S. Cl.
CPC ......... *H03F 3/245* (2013.01); *H03F 3/45475* (2013.01); *H03F 2200/138* (2013.01); *H03F 2200/144* (2013.01); *H03F 2200/171* (2013.01); *H03F 2200/234* (2013.01); *H03F 2200/267* (2013.01); *H03F 2200/411* (2013.01); *H03F 2200/451* (2013.01); *H03F 2200/66* (2013.01); *H03F 2203/45138* (2013.01); *H03F 2203/45526* (2013.01)

(58) Field of Classification Search
CPC ......... H03F 2200/138; H03F 2200/144; H03F 2200/171; H03F 2200/234; H03F 2200/267; H03F 2200/411; H03F 2200/451; H03F 2200/66; H03F 2203/45138; H03F 2203/45526

USPC .................................................. 330/252–261
See application file for complete search history.

(56) References Cited

U.S. PATENT DOCUMENTS

| | | | |
|---|---|---|---|
| 8,638,165 B2 | 1/2014 | Shah et al. | |
| 9,124,246 B2 | 9/2015 | Chang et al. | |
| 9,172,354 B2 * | 10/2015 | Ciubotaru .......... | H03H 11/0405 |
| 9,219,507 B2 | 12/2015 | Rofougaran et al. | |
| 2012/0274386 A1 | 11/2012 | Toyotaka | |
| 2014/0045443 A1 | 2/2014 | Rofougaran et al. | |
| 2014/0111280 A1 | 4/2014 | Schuppener | |

FOREIGN PATENT DOCUMENTS

| | | |
|---|---|---|
| CN | 103178748 A | 6/2013 |
| CN | 103595426 A | 2/2014 |
| CN | 104737442 A | 6/2015 |
| CN | 105024662 A | 11/2015 |
| KR | 20150146392 A | 12/2015 |

* cited by examiner

TRANS-IMPEDANCE AMPLIFIER, CHIP, AND COMMUNICATIONS DEVICE

CROSS-REFERENCE TO RELATED APPLICATION

This application is a continuation of U.S. patent application Ser. No. 16/825,708, filed on Mar. 20, 2020, which is a continuation of U.S. patent application Ser. No. 15/894,467, filed on Feb. 12, 2018, now U.S. Pat. No. 10,637,416. The U.S. patent application Ser. No. 15/894,467 claims priority to Chinese Patent Application No. 201710099963.5, filed on Feb. 23, 2017. All of the afore-mentioned patent applications are hereby incorporated by reference in their entireties.

TECHNICAL FIELD

This application relates to the field of chip technologies, and in particular, to a trans-impedance amplifier (TIA), a chip, and a communications device.

BACKGROUND

A TIA may be configured to convert a current signal to a voltage signal, and is widely applied to a receiving part of a sensor and a radio frequency transceiver system.

Currently, commonly used TIAs are a TIA of a first-order active structure is shown in FIG. 1A while a TIA of a second-order active structure is shown in FIG. 1B. Further, the TIA of the first-order active structure shown in FIG. 1A includes only one operational amplifier, and has an advantage in terms of power consumption compared with the TIA of the second-order active structure shown in FIG. 1B. The TIA of the first-order active structure, however, has a lower filtering capability. The TIA of the second-order active structure shown in FIG. 1B can perform second-order shaping filtering on an input current, and therefore has a relatively strong out-of-band interference suppression capability.

In conclusion, TIAs of common structures at present all have performance tradeoffs.

SUMMARY

The embodiment of the present disclosure provides a TIA, a chip, and a communications device, that reduce power consumption of a TIA while improving filtering performance.

According to a first aspect, a TIA is provided, including a first circuit, a second circuit, a third circuit, and an operational amplifier, where each of the first circuit, the second circuit, and the third circuit includes a passive component. The first circuit is connected to a current source, the operational amplifier, and the third circuit, and is configured to receive a first current provided by the current source, provide a third voltage to the third circuit based on the first current, perform shaping filtering on the first current and converting the processed first current to a first voltage for output, and provide the first voltage to the operational amplifier. The second circuit is connected to the current source, the operational amplifier, and the third circuit, and is configured to receive a second current provided by the current source, provide a fourth voltage to the third circuit based on the second current, perform shaping filtering on the second current and converting the processed second current to a second voltage for output, and provide the second voltage to the operational amplifier, where the first current and the second current provided by the current source are two currents in a differential current. The third circuit is configured to cooperate with the first circuit in performing shaping filtering on the first current and cooperate with the second circuit in performing shaping filtering on the second current according to the third voltage and the fourth voltage, and the operational amplifier is configured to provide a small-signal virtual ground point to the first circuit for the first current to enter the first circuit, and provide a small-signal virtual ground point to the second circuit for the second current to enter the second circuit.

The TIA in embodiments of this application includes only one operational amplifier, and has a smaller quantity of operational amplifiers compared with a TIA of a second-order active structure shown in FIG. 1B. Therefore, power consumption of the TIA in the embodiments of this application is lower. In addition, the TIA in the embodiments of this application includes the third circuit, and the third circuit can cooperate with the first circuit in performing shaping filtering on the current in the first circuit and cooperate with the second circuit in performing shaping filtering on the current in the second circuit according to the third voltage and the fourth voltage. Therefore, compared with a TIA of a first-order active structure shown in FIG. 1A, filtering performance of the TIA in the embodiments of this application is improved, and an out-of-band interference suppression capability thereof is further improved.

Based on the first aspect, in a possible design, the first circuit includes a first part and a second part, the first part and the second part are connected in parallel, one end of the parallel connection is connected to the current source and a negative input of the operational amplifier, and the other end of the parallel connection is connected to a first output of the operational amplifier, and the first part includes at least one capacitor, and the at least one capacitor is connected in series and/or in parallel, and the second part includes at least one first resistor and at least one second resistor, where the at least one first resistor is connected in series and/or in parallel, the at least one second resistor is connected in series and/or in parallel, the at least one first resistor is connected in series to the at least one second resistor, and a connection point of the series connection is connected to the third circuit.

According to the foregoing manner, an implementation of the first circuit is simplified.

Based on the first aspect, in a possible design, the second circuit includes a third part and a fourth part, the third part and the fourth part are connected in parallel, one end of the parallel connection is connected to the current source and a positive input of the operational amplifier, and the other end of the parallel connection is connected to a second output of the operational amplifier, and the third part includes at least one capacitor, and the at least one capacitor is connected in series and/or in parallel, and the fourth part includes at least one third resistor and at least one fourth resistor, where the at least one third resistor is connected in series and/or in parallel, the at least one fourth resistor is connected in series and/or in parallel, the at least one third resistor is connected in series to the at least one fourth resistor, and a connection point of the series connection is connected to the third circuit.

According to the foregoing manner, an implementation of the second circuit is simplified.

Based on the first aspect, in a possible design, the third circuit includes at least one capacitor, and the at least one capacitor is connected in series and/or in parallel.

According to the foregoing manner, an implementation of the third circuit is simplified. Moreover, the third circuit in the foregoing design can cooperate with the first circuit and the second circuit in order to improve a filtering capability, and further improve the out-of-band interference suppression capability of the TIA.

Based on the first aspect, in a possible design, the first circuit includes a first capacitor, a first resistor, and a second resistor, the first resistor and the second resistor are connected in series and then connected to the first capacitor in parallel, one end of the parallel connection is connected to the current source and a negative input of the operational amplifier, and the other end of the parallel connection is connected to a first output of the operational amplifier, and a connection point of the series connection between the first resistor and the second resistor is connected to the third circuit.

Based on the first aspect, in a possible design, the second circuit includes a second capacitor, a third resistor, and a fourth resistor, the third resistor and the fourth resistor are connected in series and then connected to the second capacitor in parallel, one end of the parallel connection is connected to the current source and a positive input of the operational amplifier, and the other end of the parallel connection is connected to a second output of the operational amplifier, and a connection point of the series connection between the third resistor and the fourth resistor is connected to the third circuit, and the first capacitor and the second capacitor have a same capacitance, and resistances of the first resistor, the second resistor, the third resistor, and the fourth resistor are the same.

Based on the first aspect, in a possible design, the third circuit includes a third capacitor, and the third circuit has a same capacitance as the first capacitor and the second capacitor.

According to a second aspect, a chip is provided, including the TIA in any possible design provided in the first aspect.

According to a third aspect, a communications device is provided, including the chip provided in the second aspect.

DESCRIPTION OF EMBODIMENTS

The term "and/or" in the embodiments of this application describes only an association relationship for describing associated objects and represents that three relationships may exist. For example, A and/or B may represent the three cases, namely: only A exists, both A and B exist, and only B exists. In addition, the character "/" in the embodiments of this application generally indicates an "or" relationship between the associated objects.

The following further describes the embodiments of this application in detail with reference to the accompanying drawings.

A TIA is configured to convert a current signal to a voltage signal, and may be integrated into a chip and applied in a communications device, for example, applied to a receiving part of a sensor in the communications device or applied in a radio frequency transceiver system of the communications device.

Figure 1A:
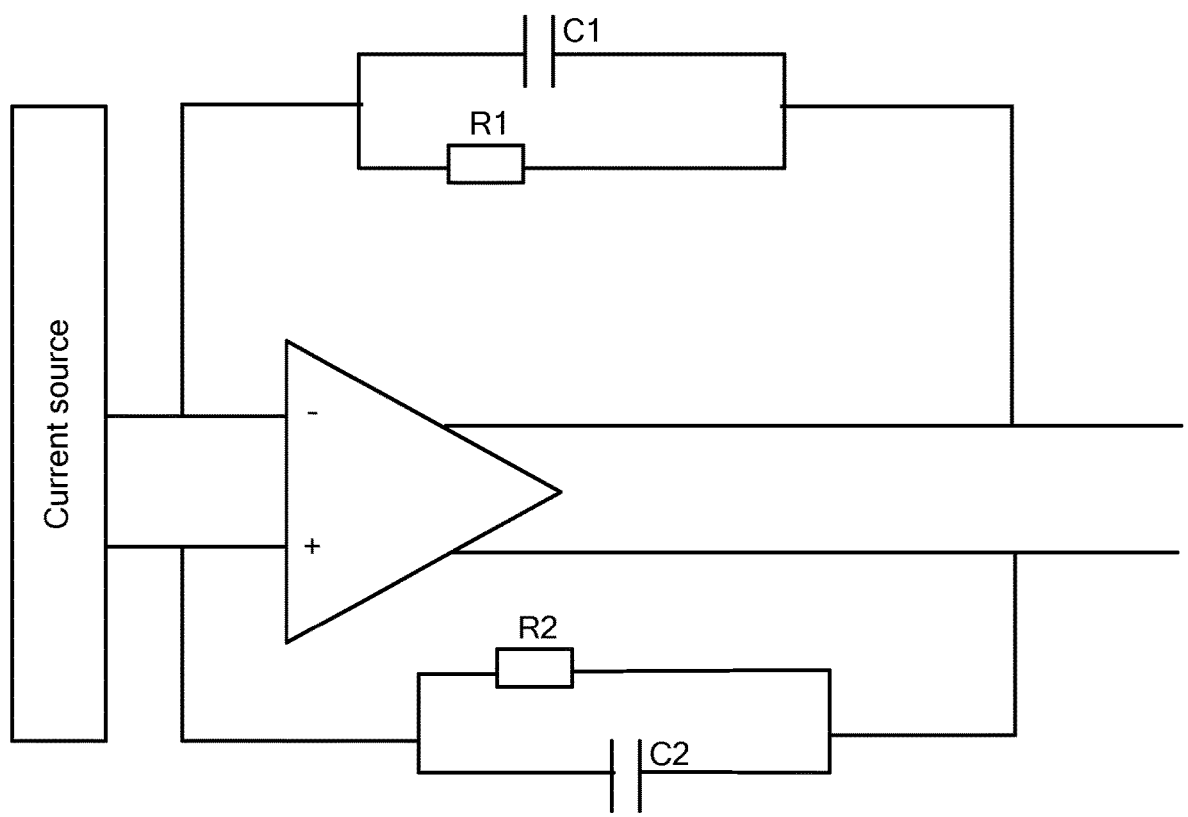
FIG. 1A shows a TIA of a first-order active structure.
Figure 1B:
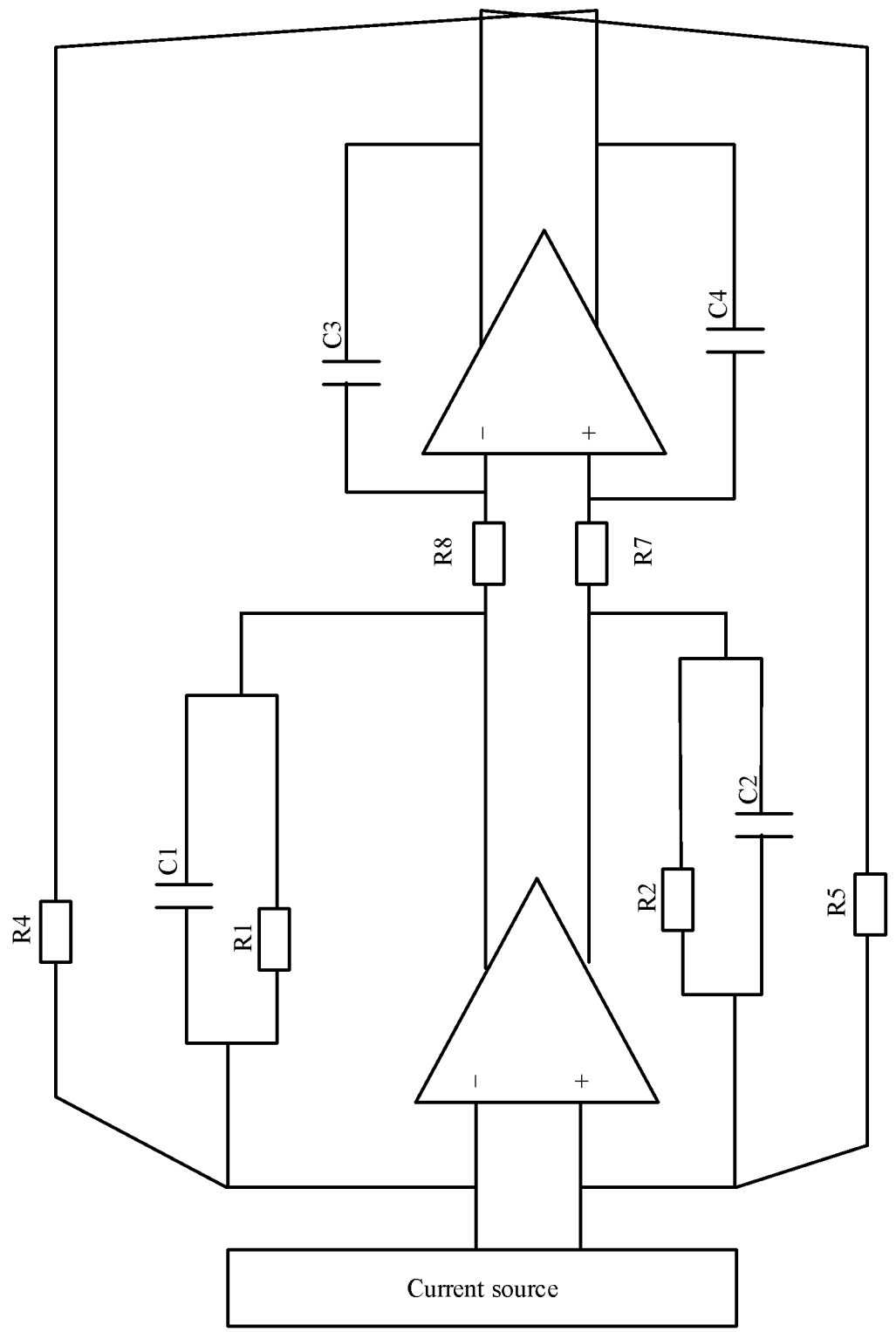
FIG. 1B shows a TIA of a second-order active structure.

A TIA in the embodiments of this application includes only one operational amplifier, and has a smaller quantity of operational amplifiers compared with a TIA of a second-order active structure shown in FIG. 1B. Therefore, power consumption of the TIA in the embodiments of this application is lower. In addition, the TIA in the embodiments of this application includes a third circuit, and the third circuit can cooperate with a first circuit in performing shaping filtering on a current in the first circuit, and cooperate with a second circuit in performing shaping filtering on a current in the second circuit according to the third voltage and the fourth voltage. Therefore, compared with a TIA of a first-order active structure shown in FIG. 1A, filtering performance of the TIA in the embodiments of this application is improved, and an out-of-band interference suppression capability thereof is further improved.

Figure 2:
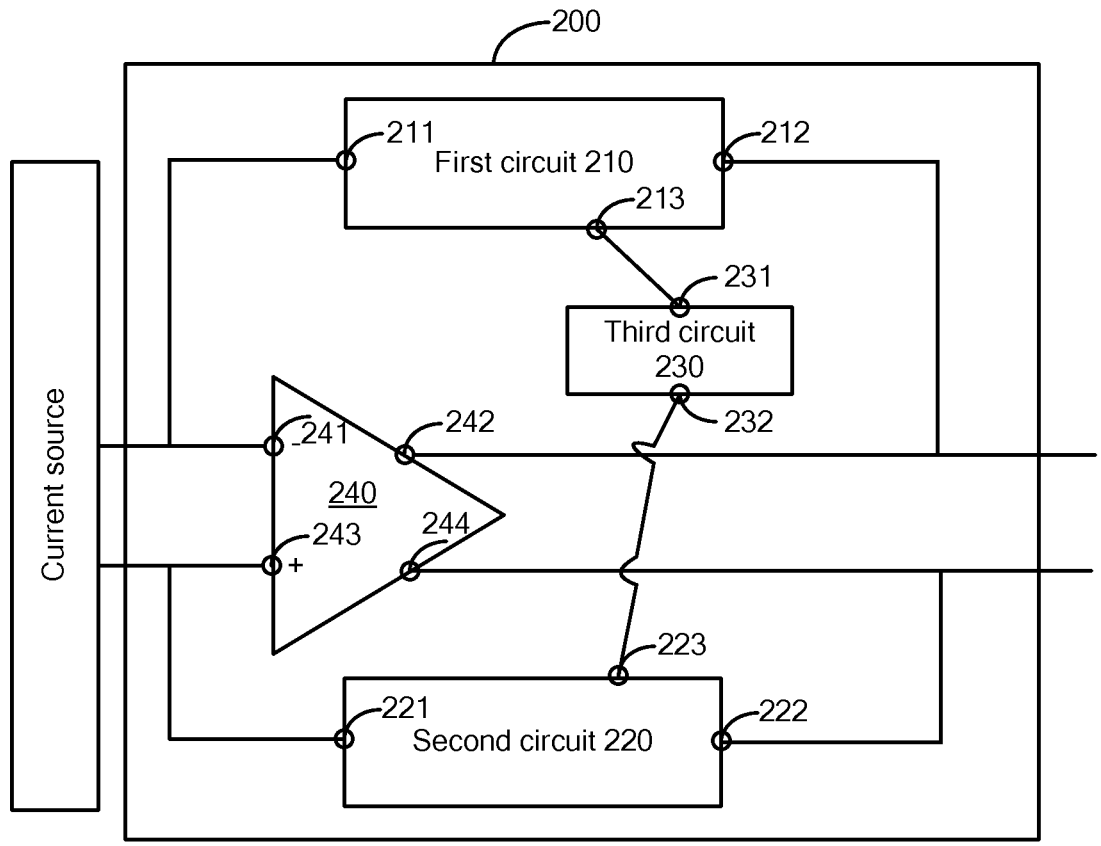
FIG. 2 is a schematic structural diagram of a TIA according to an embodiment of this application.

As shown in FIG. 2, a TIA 200 in an embodiment of this application includes a first circuit 210, a second circuit 220, a third circuit 230, and an operational amplifier 240. Each of the first circuit 210, the second circuit 220, and the third circuit 230 includes a passive component.

The first circuit 210 is connected to a current source, the operational amplifier 240, and the third circuit 230, and is configured to receive a first current provided by the current source, provide a third voltage to the third circuit 230 based on the first current, perform shaping filtering on the first current and converting the processed first current to a first voltage for output, and provide the first voltage to the operational amplifier 240.

A first end 211 of the first circuit 210 is connected to one end of the current source and a negative input 241 of the operational amplifier 240, a second end 212 of the first circuit 210 is connected to a first output 242 of the operational amplifier 240, and a third end 213 of the first circuit 210 is connected to one end 231 of the third circuit 230. The first circuit 210 is configured to receive the first current provided by the current source using the first end 211, provide the third voltage to the end 231 of the third circuit 230 based on the first current, perform shaping filtering on the first current and converting the processed first current to the first voltage, and output the first voltage using the second end 212. Because the second end 212 of the first circuit 210 is connected to the first output 242 of the operational amplifier 240, a voltage of the first output 242 is set to the first voltage.

The second circuit 220 is connected to the current source, the operational amplifier 240, and the third circuit 230, and is configured to receive a second current provided by the current source, provide a fourth voltage to the third circuit 230 based on the second current, perform shaping filtering on the second current and converting the processed second current to a second voltage for output, and provide the second voltage to the operational amplifier 240. The first current and the second current provided by the current source are two currents in a differential current.

A first end 221 of the second circuit 220 is connected to the other end of the current source and a positive input 243 of the operational amplifier 240, a second end 222 of the second circuit 220 is connected to a second output 244 of the operational amplifier 240, and a third end 223 of the second circuit 220 is connected to the other end 232 of the third circuit 230. The second circuit 220 is configured to receive the second current provided by the current source using the first end 221 of the second circuit 220, provide the fourth voltage to the other end 232 of the third circuit 230 based on the second current, perform shaping filtering on the second current and converting the processed second current to the second voltage, and output the second voltage using the second end 222. Because the second output 244 of the operational amplifier 240 is connected to the second end 222, a voltage of the second output 244 is set to the second voltage by the second circuit 220.

The third circuit 230 is configured to cooperate with the first circuit 210 in performing shaping filtering on the first current and cooperate with the second circuit 220 in performing shaping filtering on the second current according to the third voltage and the fourth voltage.

The operational amplifier 240 is configured to provide a small-signal virtual ground point to the first circuit 210 for the first current to enter the first circuit 210, and provide a small-signal virtual ground point to the second circuit 220 for the second current to enter the second circuit 220.

The operational amplifier 240 is configured to provide the small-signal virtual ground points to the first circuit 210 and the second circuit 220, respectively.

The operational amplifier 240 provides the small-signal virtual ground point to the first end 211 of the first circuit 210 using the negative input 241 to make a voltage of the first end 211 set to zero such that the first current provided by the current source enters the first circuit 210. The operational amplifier 240 provides the small-signal virtual ground point to the first end 221 of the second circuit 220 using the positive input 243 to make a voltage of the first end 221 set to zero such that the second current provided by the current source enters the second circuit 220.

It should be understood that, the passive component includes a component such as a capacitor, an inductor, and a resistor. Passive components may be used to form the first circuit 210, the second circuit 220, and the third circuit 230 to implement functions in this embodiment of this application. A quantity and type of the passive components are not limited herein.

In a possible design, the first circuit 210 includes a first part and a second part, the first part and the second part are connected in parallel, one end (that is, the first end 211) of the parallel connection is connected to the current source and the negative input 241 of the operational amplifier 240, and the other end (that is, the second end 212) of the parallel connection is connected to the first output 242 of the operational amplifier 240.

The first part includes at least one capacitor, and the at least one capacitor is connected in series and/or in parallel. The second part includes at least one first resistor and at least one second resistor, where the at least one first resistor is connected in series and/or in parallel, the at least one second resistor is connected in series and/or in parallel, the at least one first resistor is connected in series to the at least one second resistor, the at least one first resistor is connected in series to the at least one second resistor, and a connection point of the series connection is connected to the third circuit 230. Further, the connection point of the series connection is connected to the end 231 of the third circuit 230, and the connection point of the series connection is the third end 213 of the first circuit 210.

Figure 3A:
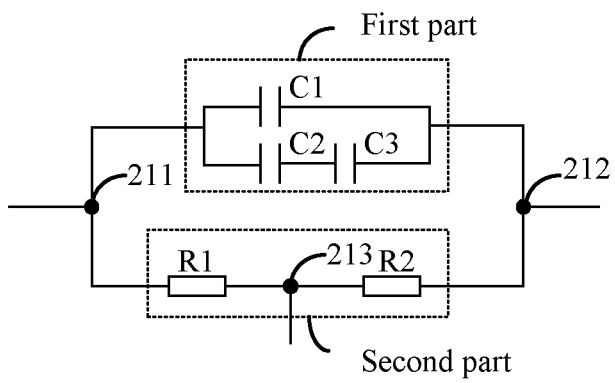
FIG. 3A and FIG. 3B are schematic structural diagrams of a first circuit according to an embodiment of this application.
Figure 3B:
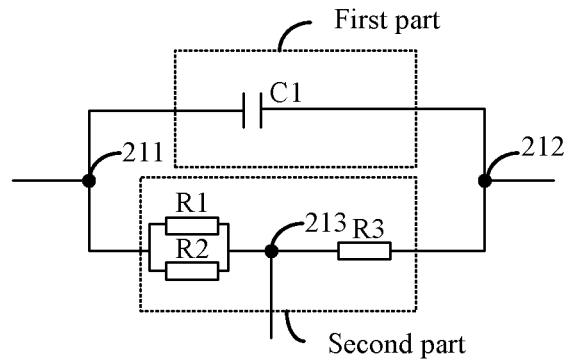

For example, in a first circuit 210 shown in FIG. 3A, a first part includes three capacitors C1, C2, and C3, and a second part includes a first resistor R1 and a second resistor R2. In a first circuit 210 shown in FIG. 3B, a first part includes a capacitor C1, and a second part includes a first resistor R1, a first resistor R2, and a second resistor R3. In addition to connection manners of the first circuit 210 shown in FIG. 3A and FIG. 3B, for the first circuit 210 in this embodiment of this application, there may be another connection manner equivalent to those in FIG. 3A and FIG. 3B.

In a possible implementation, for example, the second circuit 220 includes a third part and a fourth part in parallel, one end (that is, the first end 221) of the parallel connection is connected to the current source and the positive input 243 of the operational amplifier 240, and the other end (that is, the second end 222) of the parallel connection is connected to the second output 244 of the operational amplifier 240.

The third part includes at least one capacitor, and the at least one capacitor is connected in series and/or in parallel. The fourth part includes at least one third resistor and at least one fourth resistor, where the at least one third resistor is connected in series and/or in parallel, the at least one fourth resistor is connected in series and/or in parallel, the at least one third resistor is connected in series to the at least one fourth resistor, and a connection point of the series connection is connected to the third circuit 230. Further, the connection point of the series connection is connected to the other end 232 of the third circuit 230, and the connection point of the series connection is the third end 223 of the second circuit 220.

Figure 4A:
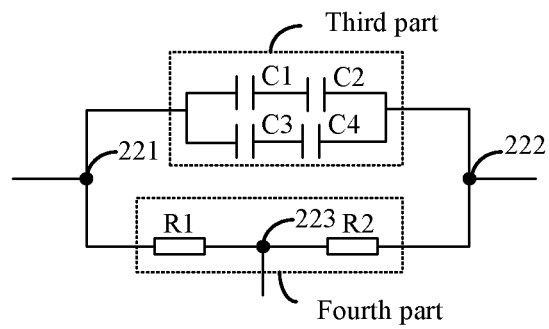
FIG. 4A and FIG. 4B are schematic structural diagrams of a second circuit according to an embodiment of this application.
Figure 4B:
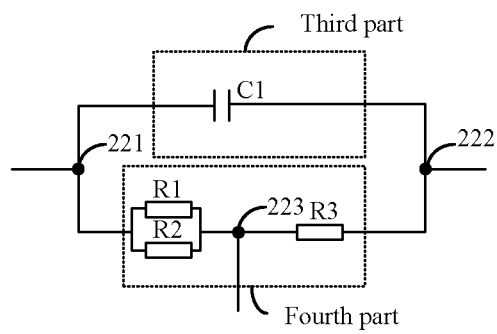

For example, in a second circuit 220 shown in FIG. 4A, a third part includes four capacitors C1, C2, C3, and C4, and a fourth part includes a third resistor R1 and a fourth resistor R2. In a second circuit 220 shown in FIG. 4B, a third part includes a capacitor C1, and a fourth part includes a third resistor R1, a third resistor R2, and a fourth resistor R3. In addition to connection manners of the second circuit 220 shown in FIG. 4A and FIG. 4B, for the second circuit 220 in this embodiment of this application, there may be another connection manner equivalent to those in FIG. 4A and FIG. 4B.

It should be understood that, the connection manners of the first circuit 210 and the second circuit 220 may be the same or may be different, and a quantity of capacitors and quantities of first resistors, second resistors, third resistors, and fourth resistors in the first circuit 210 and the second circuit 220 are not limited.

In a possible design, the third circuit 230 includes at least one capacitor, and the at least one capacitor is connected in series and/or in parallel.

Figure 5:
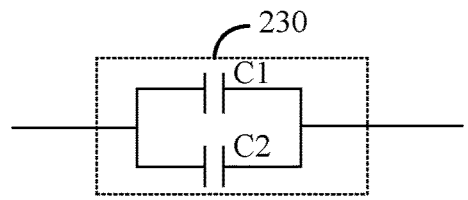
FIG. 5 is a schematic structural diagram of a third circuit according to an embodiment of this application.

For example, if the third circuit 230 includes two capacitors C1 and C2, as shown in FIGS. 5, C1 and C2 are connected in parallel in the third circuit 230. One end of the third circuit 230 is connected to the third end 213 of the first circuit 210, and the other end of the third circuit 230 is connected to the third end 223 of the second circuit 220. It should be understood that, a quantity of capacitors included in the third circuit 230 is not limited in this embodiment of this application.

It should be noted that, in this embodiment of this application, a resistance and a capacitance may be set according to an actual need, to obtain a required voltage.

Figure 6:
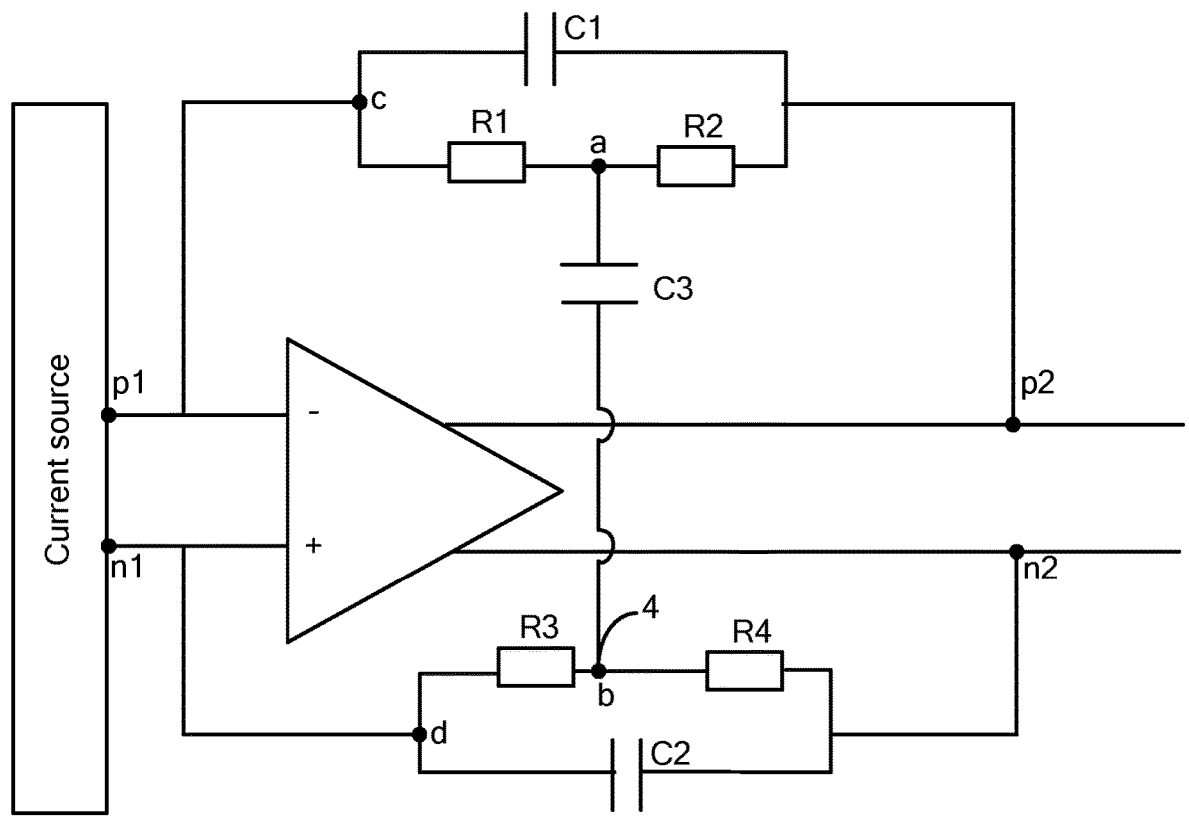
FIG. 6 is a schematic structural diagram of a TIA according to an embodiment of this application.

The following uses a TIA shown in FIG. 6 as an example and assumes that a gain of an operational amplifier within an operating frequency range is infinite to perform qualitative analysis on the TIA in the embodiments of this application using a small-signal equation.

As shown in FIG. 6, the TIA includes capacitors C1, C2, and C3, resistors R1, R2, R3, and R4, and an operational amplifier. A current source provides a differential current to the TIA, C1, R1, and R2 form a first circuit, C3 forms a third circuit, and C2, R3, and R4 form a second circuit. A current of the differential current flows into the first circuit through p1, and the other current of the differential current flows into the second circuit through n1.

A negative input of the operational amplifier provides a small-signal virtual ground point to the first circuit, and a positive input of the operational amplifier provides a small-signal virtual ground point to the second circuit. It is assumed that voltages at a point a, a point b, a point p2, and a point n2 shown in FIG. 6 are Va, Vb, Vp, and Vn, respectively, a current that the current source provides to the first circuit is i1, and a current that the current source provides to the second circuit is i2, a sum of currents that flow through the point a, the point b, a point c, and a point d respectively is zero. In this case, the following formulas are obtained:

$$(Va-0)/R1 + (Va+Vp)/R2 + (Va-Vb)\bigg/ \frac{1}{j\omega C3} = 0 \quad (1)$$

$$(Vb-0)/R3 + (Vb+Vn)/R4 + (Vb-Va)\bigg/ \frac{1}{j\omega C3} = 0 \quad (2)$$

$$-i1 + (0-Va)/R1 + (0-Vp)\bigg/ \frac{1}{j\omega C1} = 0 \quad (3)$$

$$-i2 + (0-Vb)/R3 + (0-Vn)\bigg/ \frac{1}{j\omega C2} = 0, \quad (4)$$

where $\omega$ indicates an operating frequency, when R1=R2=R3=R4=R and C1=C2=C3=C, a transfer function is obtained as follows:

$$\frac{Vout}{Iin} = \frac{Vp - Vn}{i1 - i2} = \frac{2R(1 + R \cdot C \cdot j\omega)}{1 + 2R \cdot C \cdot j\omega + 2R^2 \cdot C^2 \cdot (j\omega)^2}.$$

Figure 7:
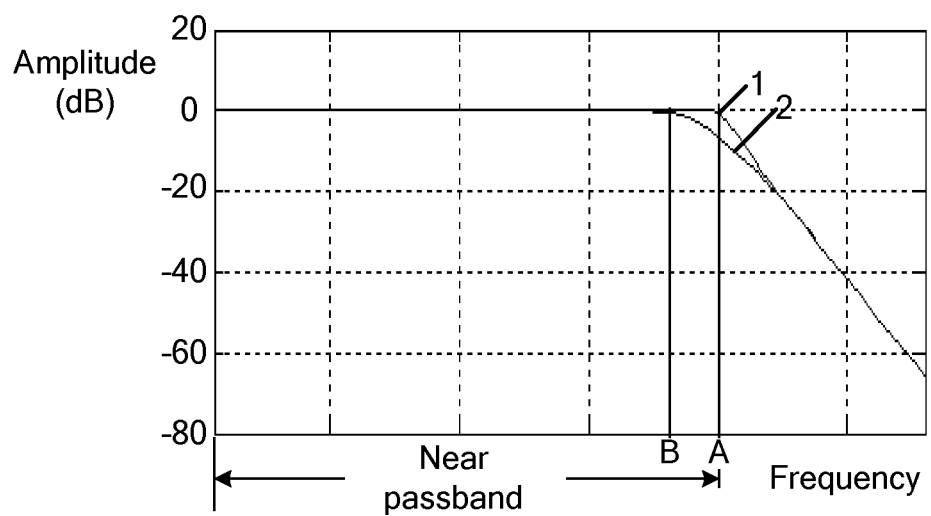
FIG. 7 is a comparison diagram of amplitude-frequency characteristic curves of a TIA in an embodiment of this application and a TIA of a first-order active structure.

It can be learned from the transfer function that, the transfer function includes two poles and one zero, and the zero and one pole form a zero-pole pair on a near passband. Compared with a first-order active RC structure, in-band flatness of the TIA in the embodiments of this application is improved. If a same 3 decibels (dB) corner frequency is used, the TIA in the embodiments of this application has a better out-of-band suppression characteristic compared with a TIA of a first-order active structure. As shown in FIG. 7, a curve 1 is an amplitude-frequency characteristic curve when R1=R2=R3=R4=R and C1=C2=C3=C, while a curve 2 is an amplitude-frequency characteristic curve of a TIA that is of a first-order active structure and to which C3 is not added. It can be learned from FIG. 7 that, the TIA in the embodiments of this application has a second-order characteristic on a near passband and has better flatness. In FIG. 7, 3 dB corner frequencies of the curve 1 and the curve 2 are different. The 3 dB corner frequency of the curve 1 is A, and the 3 dB corner frequency of the curve 2 is B. If the TIA in the embodiments of this application has a same 3 dB corner frequency requirement as the TIA of the first-order active structure, the amplitude-frequency characteristic curve in the embodiments of this application has a better out-of-band suppression characteristic. In addition, the TIA in the embodiments of this application uses only one operational amplifier such that power consumption of the TIA is reduced compared with a TIA of a second-order active structure.

In addition, the embodiments of this application further provide a chip, including any TIA provided in the embodiments of this application.

The embodiments of this application further provide a communications device, including the chip provided in the embodiments of this application.

For a connection manner of a TIA in the chip or in the communications device, refer to the connection manner of the TIA shown in FIG. 2. Details are not described herein.

Although some specific embodiments that can be implemented have been described, persons skilled in the art can make changes and modifications to these embodiments once they learn the basic inventive concept. Therefore, the following claims are intended to be construed to cover the embodiments described in this application and all changes and modifications falling within the scope of this application.

Obviously, persons skilled in the art can make various modifications and variations to this application without departing from the spirit and scope of this application. This application is intended to cover these modifications and variations of this application provided that they fall within the scope of protection defined by the following claims and their equivalent technologies.

The invention claimed is:

1. An integrated circuit comprising:
   an amplifier comprising: a pair of inputs comprising a first input and a second input;
   a first resistor;
   a second resistor, wherein the first resistor and the second resistor are disposed in series and coupled to the first input;
   a third resistor;
   a fourth resistor, wherein the third resistor and the fourth resistor are disposed in series and coupled to the second input;
   a first capacitor comprising: a first end coupled to a first point between the first resistor and the second resistor; and a second end coupled to a second point between the third resistor and the fourth resistor;
   a second capacitor disposed in parallel with the first resistor and the second resistor, and coupled to the first input;
   a third capacitor disposed in parallel with the third resistor and the fourth resistor, and coupled to the second input; and
   output for producing an amplified output from the amplifier.

2. The integrated circuit of claim 1, wherein the amplifier is an operational amplifier.

3. The integrated circuit of claim 1, further comprising a current source configured to provide the differential signal to the amplifier.

4. The integrated circuit of claim 1, wherein the amplifier comprises an output, the output is coupled to the second capacitor.

5. The integrated circuit of claim 1, wherein the amplifier comprises a first output and a second output, the first output is coupled to the second capacitor, and the second output is coupled to the third capacitor.

6. The integrated circuit of claim 1 wherein the first and second inputs are coupled to receive a current signal from the pair of inputs and wherein the amplifier is a transimpedance amplifier configured to amplify a current signal.

7. An integrated circuit comprising:
- A transimpedance amplifier comprising: a pair of inputs comprising a first input and a second input and a pair of outputs;
- a first resistor coupled to the first input of the amplifier;
- a second resistor coupled in series with the first resistor and to a first output of the pair of outputs;
- a third resistor coupled to the second input of the amplifier;
- a fourth resistor coupled in series with the third resistor and to a second output of the pair of outputs;
- a first capacitor comprising: a first end coupled to a first point between the first resistor and the second resistor; and a second end coupled to a second point between the third and fourth resistors;
- first capacitive circuitry coupled across the first and second resistors and between the first input and the first output; and
- second capacitive circuitry coupled across the third and fourth resistors and between the second input and the second output.

8. The integrated circuit of claim 7, wherein the transimpedance amplifier comprises first resistor and the second resistor bridges disposed over the amplifier inputs and outputs.

9. The integrated circuit of claim 7, wherein the transimpedance amplifier is configured to amplify a differential current signal received at the first and second inputs.

10. The integrated circuit of claim 7 wherein the first capacitive circuitry and the second capacitive circuitry comprise any combination of capacitive elements connected in parallel and/or in series to produce a capacitive value.

11. The integrated circuit of claim 7 wherein any one or more of the first, second, third and fourth resistors comprises a resistor ladder.

12. The integrated circuit of claim 7 wherein any one or more of the first, second, third and fourth resistors comprises any combination of resistive elements connected in parallel and/or in series to produce a resistive value.

* * * * *